United States Patent [19]

Escoffier et al.

[11] Patent Number: 5,281,299

[45] Date of Patent: Jan. 25, 1994

[54] METHOD FOR MANUFACTURING A CRYSTAL WITH A LATTICE PARAMETER GRADIENT

[75] Inventors: Alain Escoffier, Grenoble; Roland Madar, Eybens; Andreas Magerl, Saint Ismier; Eric Mastromatteo, Saint Martin d'Heres. all of France

[73] Assignees: Institut Max Von Laue; Institut National Polytechnique de Grenoble, Grenoble, France

[21] Appl. No.: 908,268

[22] Filed: Jul. 2, 1992

[30] Foreign Application Priority Data

Jul. 5, 1991 [FR] France ............................... 91 09109

[51] Int. Cl.⁵ ............................................ H01L 21/20
[52] U.S. Cl. .................................... 156/612; 437/131; 437/132; 437/100; 148/DIG. 59
[58] Field of Search ............... 156/612; 148/DIG. 59, 148/DIG. 49; 437/131, 132, 100

[56] References Cited

U.S. PATENT DOCUMENTS

| | | | |
|---|---|---|---|
| 4,357,183 | 11/1982 | Fan et al. ............................. | 156/612 |
| 4,804,639 | 2/1989 | Yablonovitch ....................... | 156/612 |
| 4,833,101 | 5/1989 | Fujii ..................................... | 156/612 |
| 4,981,818 | 1/1991 | Anthony et al. ..................... | 437/100 |

FOREIGN PATENT DOCUMENTS

0006118A1  1/1980  European Pat. Off. .

59-98533  6/1984  Japan .................................. 437/100
0110726  4/1989  Japan .................................. 437/100

OTHER PUBLICATIONS

"Metal-organic vapor-phase epitaxy with a novel reactor and characterization of multilayer structures", vol. 43, No. 5–6, May 1987, M. R. Leys et al., pp. 133–142.

"Cooperative growth phenomena in silicon/germanium low-temperature epitaxy", B. S. Meyerson et al., vol. 53, No. 25, Dec. 1988, pp. 2555–2557.

"Growth of Ge Si Layers by Rapid Thermal Processing Chemical Vapor Deposition", K. H. Jung et al., vol. 89/91, May 1, 1990, pp. 216–217.

"Selective heteroepitaxial growth of Si Ge using gas source molecular beam epitaxy", H. Hirayama et al., vol. 56, No. 12, Mar. 1990, pp. 1107–1199 x.

*Primary Examiner*—Robert Kunemund
*Assistant Examiner*—Ramamohan Rao Paladugu
*Attorney, Agent, or Firm*—Lowe, Price, LeBlanc & Becker

[57] ABSTRACT

A method for manufacturing a crystal comprising at least two elements wherein the proportion of at least one of the elements varies in the direction of the thickness. A CVD process is used. The proportion of the gas components from which is formed the deposition is varied with time. The invention applies to the manufacturing of $Si_xGe_{1-x}$ crystals.

6 Claims, No Drawings

METHOD FOR MANUFACTURING A CRYSTAL WITH A LATTICE PARAMETER GRADIENT

BACKGROUND OF THE INVENTION

The invention relates to crystallogenesis and more particularly to the manufacturing of crystals comprising a plurality of elements wherein the proportion of at least one of the elements is continuously variable, whereby the lattice parameter value of those crystals presents a gradient. Such crystals will be simply called hereinafter gradient crystals.

Gradient crystals are for example usable as monochromators for small wavelength radiations such as neutrons or X-rays.

The idea of using gradient crystals as radiation monochromators appears for example in German patent application 1816542 filed on Dec. 23, 1968 in the name of Institut Max von Laue-Paul Langevin, Grenoble. In this application, the advantage of crystals such as $Si_xGe_{1-x}$ (x designating a value comprised between 0 and 1) is emphasized.

Accordingly, for more than twenty years, the advantage of manufacturing gradient crystals has been sensed. However, it has not been possible to industrially manufacture such crystals which are real single crystals, are large enough, and have a composition variation range sufficient for providing a satisfactory lattice gradient. Indeed, one aims to obtain crystals having a size greater than some millimeters, for example a length in the gradient direction of about 10 mm.

Two types of crystal growth processes are known: the processes starting from a liquid phase and the processes starting from gazeous phase. Those two crystal growth families have been known for a long time. Generally, the processes using a liquid phase are used for obtaining large size crystals while the gaseous phase processes, such as the gaseous epitaxies are used for manufacturing thin layer crystals, for example in the field of microelectronics.

During those last twenty years, the approach for manufacturing gradient crystals was based on the liquid phase processes and more particularly on pulling processes wherein, during the pulling, the composition of the liquid phase is continuously varied. Those processes have not given satisfactory results. In particular, for manufacturing gradient crystals of the type $Si_xGe_{1-x}$, those processes have provided single crystals only if the composition variation of germanium with respect to silicium was not higher than some percentage units.

Accordingly, an object of the invention is to provide a general process for manufacturing gradient single crystals which results in a relatively rapid manufacturing while providing a large composition range and a substantial thickness.

SUMMARY OF THE INVENTION

In order to achieve those objects, the invention uses vapor phase chemical deposition (CVD) techniques, known in particular in the field of manufacturing semiconductor components, while adapting those methods to the specific problem of gradient crystal manufacturing. The use of CVD has never been suggested in the art, apparently due to a double obstacle.

The first obstacle is that the CVD methods developed for manufacturing semiconductor components aims at manufacturing thin layers having thicknesses in the range of a micrometer. For such thicknesses, relatively slow deposition methods are acceptable. So, usually, the deposition methods in the field of semiconductors provide slow growth speed. For example, a usual method for depositing silicon-germanium uses a mixture of silane ($SiH_4$) and germane ($GeH_4$) with low pressure hydrogen (0,1 pascal) and at a temperature in the range of 500°-600° C. Accordingly, the growth speed is in the range of 1 to 5 nm per minute, which provides, for the higher value, a growth speed of 7 micrometers per day. With such speed, many years are needed for obtaining a crystal thickness in the range of 10 millimeters.

However, it is known that it is possible to increase the deposition speed by increasing the temperature of the substrate on which the deposition is carried out. However, one then meets a second obstacle which is that, inside a crystal, solid state diffusion phenomenae appear which are, for example, used for obtaining differently doped regions in a semiconductor component. Additionally, it is known that this diffusion speed increases with the temperature and becomes very high when the melting temperature of the crystal is approached. For example, it is known that if a germanium layer is epitaxially grown on a silicon layer, after an annealing of twenty hours at 1000° C., one obtains a $Si_{1-x}Ge_x$ intermediate layer of 200 nm.

It is likely because of this second obstacle that it has never been tried to manufacture gradient crystals by CVD. Indeed, knowing that, when the temperature of a crystal comprising different atoms increases, the crystal composition moves towards an homogeneization, it was thought that it was not possible to obtain gradient crystal by CVD epitaxy at a high temperature.

The applicant showed that this second obstacle was in fact a preconceived idea and that, in case of a gradient crystal formed by CVD in the following conditions, this interdiffusion and homogeneization phenomenon does not appear or appears only negligeably.

So, the invention provides a method for manufacturing a crystal comprising at least two elements wherein the proportion of at least one of those elements varies in a given direction, consisting in epitaxially growing the crystal by CVD while changing as a function of time, the proportion of each of the components of the gas from which is formed the deposition, at a temperature comprised between 10 and 30 percent under the melting temperature of the crystal.

In an application of the invention, the considered crystal is $Si_xGe_{1-x}$. The deposition gas are a mixture of silane and germane with hydrogen. The deposition is made at a gas pressure of about 100 pascals and at a temperature comprised between 950° and 1200° C.

According to an implementation of the invention, the composition of the gas mixture is modified so that the composition variation is of some percentage units per millimeter in the obtained crystal.

EXAMPLE

In a practical experiment, a silicon substrate at a temperature of 1000° C. has been placed in a cold wall reactor at a total pressure of 100 pascals (1 Torr). In this reactor, gases are circulated at a rate of 1 liter per minute, those gases comprising a mixture of $SiH_4$ (50-100 cm$^3$/mn), HCl (2-10 cm$^3$/mn) and the remaining part being hydrogen. Progressively, an increasing proportion of $GeH_4$ was introduced while the quantity of $SiH_4$ was maintained constant, for obtaining an $Si_xGe_{1-x}$ growth with a decreasing value of x. After 24 hours, a $Si_xGe_{1-x}$ crystal having a thickness of 1 mm was obtained. The growth speed was about 0,6-0,8 micrometer per minute, that is more than 1000 times higher than the prior art speeds. When using a pure silicon substrate, and varying the germane concentration in the mixture as indicated, a surface composition corresponding to $Si_{0.97}Ge_{0.03}$ was obtained for a thickness of one millimeter.

The results obtained by the applicant show that, for thicker layers (10 mm), it will be possible to obtain a surface composition corresponding to $Si_{0.70}Ge_{0.30}$.

It will also be possible, starting from a germanium substrate to arrive to an external layer having a surface composition corresponding to $Ge_{0.70}Si_{0.30}$.

For manufacturing a monochromator, the starting silicon or germanium substrate can be kept or this substrate can be ground off for keeping only the gradient crystal part.

Instead of silane and germane, it is possible to use halogenated derivatives such as $SiH_{4-n}Cl_n$ or $GeH_{4-n}Cl_n$.

Although the above example only relates to $Si_xGe_{1-x}$, the invention generally applies to the formation of other gradient crystals, for example $Ga_{1-x}Al_xAs$ or $In_{1-x}Ga_xP$.

It will be noted that the method according to the invention allows to avoid two problems which make the liquid phase growth difficult, if not impossible, in case of $Si_xGe_{1-x}$.

First, a germanium atom in a silicon matrix corresponds to a defect which creates long distance dislocations. This effect prevents a crystalline growth when the silicon lattice is not rigid enough, which is the case for a temperature higher than about 1000°–1200° C.

Secondly, the constituent concentrations of an alloy are different in the liquid phase and in the solid phase. They have to be equilibrated by the dynamic processes close to the solidification front. In case of $Si_xGe_{1-x}$, those differences are very important. They cause a high exchange of material close to the solidification front. As a consequence, the solidification front is not stable and a single crystal growth cannot be maintained.

We claim:

1. A method for manufacturing a crystal comprising at least two elements of Group IV wherein the concentration of at least one element varies along a thickness of said crystal, wherein a CVD crystal growth is used, while varying as a function of time the proportion of each of the components of the gas from which the growth is formed, at a temperature comprised between about 10 and about 30 percent less than the melting temperature of the crystal so as to produce a crystal having thickness of at least about 1 millimeter.

2. A method for manufacturing a $Si_xGe_{1-x}$ crystal, where x is between zero and 1 and varies as a function of the thickness of the crystal, wherein this crystal is grown by a CVD method, while varying the proportion of Si or Ge deposition gas during the growth, at a temperature comprised between about 950° and about 1200° C. so as to produce a crystal thickness of at least one millimeter.

3. A method according to claim 2 wherein the deposition gases are a mixture of silane and germane, with hydrogen.

4. A method according to claim 3 wherein the total gas pressure is about 100 pascals.

5. A method according to claim 3 wherein the composition of the gas mixture is varied to obtain a crystal having predetermined percentages of Si and Ge.

6. A method for manufacturing a crystal according to claim 1, wherein the produced crystal has a thickness of up to about 10 millimeters.

* * * * *